(12) United States Patent
Ryu et al.

(10) Patent No.: US 7,764,113 B2
(45) Date of Patent: Jul. 27, 2010

(54) OUTPUT CIRCUIT

(75) Inventors: Takashi Ryu, Kyoto (JP); Takuya Ishii, Osaka (JP); Naoyuki Nakamura, Kyoto (JP); Hirohisa Tanabe, Kyoto (JP)

(73) Assignee: Panasonic Corporation, Osaka (JP)

( * ) Notice: Subject to any disclaimer, the term of this patent is extended or adjusted under 35 U.S.C. 154(b) by 29 days.

(21) Appl. No.: 12/169,462

(22) Filed: Jul. 8, 2008

(65) Prior Publication Data

US 2009/0015299 A1 Jan. 15, 2009

(30) Foreign Application Priority Data

Jul. 11, 2007 (JP) ............................. 2007-181743

(51) Int. Cl.
G05F 1/10 (2006.01)
G05F 3/02 (2006.01)
(52) U.S. Cl. ...................... 327/541; 327/540
(58) Field of Classification Search .............. 327/540, 327/541
See application file for complete search history.

(56) References Cited

U.S. PATENT DOCUMENTS 5,828,245 A 10/1998 Brambilla 6,020,781 A 2/2000 Fujioka
6,150,873 A 11/2000 Sohn
2007/0222502 A1* 9/2007 Noda ......................... 327/541

FOREIGN PATENT DOCUMENTS

JP 03-204012 9/1991
JP 03-204013 9/1991
JP 04-172963 6/1992

* cited by examiner

Primary Examiner—Lincoln Donovan
Assistant Examiner—Daniel Rojas
(74) Attorney, Agent, or Firm—Dickinson Wright PLLC

(57) ABSTRACT

A reference voltage is applied from a reference voltage generating circuit to the non-inverting input terminal of an amplifier for supplying a drive voltage to the gate terminal of an NMOS transistor, and the output voltage appearing at the source terminal of the NMOS transistor is divided by a resistor pair and applied to the inverting input terminal of the amplifier. The voltage obtained by adding a voltage equal to or higher than the voltage for sufficiently driving the NMOS transistor to the output voltage appearing at the source terminal of the NMOS transistor is generated by a charge pump circuit and supplied to the amplifier as a power supply voltage. With this configuration, the drive voltage for the NMOS transistor is suppressed to the required minimum voltage while the drive voltage is obtained securely. The power consumption in the amplifier can thus be suppressed.

11 Claims, 4 Drawing Sheets

OUTPUT CIRCUIT

BACKGROUND OF THE INVENTION

1. Field of the Invention

The present invention relates to an output circuit for a series regulator or a power amplifier, and more particularly, to an output circuit in which an NPN transistor or an NMOS transistor is used as an output transistor.

2. Prior Art

A PMOS transistor is frequently used as an output transistor in a series regulator as typified by an LDO (low drop out regulator) or a power amplifier that supplies a controlled voltage to a load circuit. However, the PMOS transistor has a problem that its chip area is larger than that of an NMOS transistor having the same current capacity.

On the other hand, when an NMOS transistor is used as an output transistor, the voltage obtained by adding the output voltage to the gate threshold voltage of the NMOS transistor is required as the drive voltage for the NMOS transistor. Accordingly, a proposal has been made in which in a series regulator wherein an NMOS transistor is used as an output transistor, a voltage stepped up from the input voltage is generated using a charge pump to securely obtain a drive power supply for the NMOS transistor, as disclosed in Japanese Patent Application Laid-Open Publication No. Hei 3-204012.

The circuit configuration of the series regulator disclosed in Japanese Patent Application Laid-Open Publication No. Hei 3-204012 is shown in FIG. 4. In FIG. 4, numeral 1 designates an input terminal. An input voltage Vin is applied to this input terminal 1.

Numeral 2 designates an output terminal. This output terminal 2 supplies an output voltage Vout to a load 3.

Numeral 4 designates an NMOS transistor serving as an output transistor. This NMOS transistor 4 is connected between the input terminal 1 and the output terminal 2.

Numeral 5 designates an amplifier. This amplifier 5 supplies a drive voltage to the gate terminal of the NMOS transistor 4.

Numeral 6 designates a reference voltage generating circuit. This reference voltage generating circuit 6 generates a reference voltage Vref and applies the generated reference voltage Vref to the non-inverting input terminal (+) of the amplifier 5.

Numeral 7 designates a resistor pair consisting of a series circuit of two voltage-dividing resistors. This resistor pair 7 divides the output voltage Vout, and the divided voltage is applied to the inverting input terminal (−) of the amplifier 5.

Numeral 9 designates a charge pump circuit. This charge pump circuit 9 generates a voltage stepped up from the input voltage Vin, and this stepped-up voltage is supplied to the amplifier 5 as a power supply voltage.

The operation of the series regulator shown in FIG. 4 will be described below. When the input voltage Vin is applied to the input terminal 1, the charge pump circuit 9 operates, and the voltage stepped up from the input voltage Vin is supplied to the amplifier 5. The NMOS transistor 4 is driven by the amplifier 5, and the output voltage Vout is output from the output terminal 2. The output voltage Vout is negatively fed back to the amplifier 5 through the resistor pair 7. The amplifier 5 controls the NMOS transistor 4 so that the divided voltage of the output voltage Vout, being output from the resistor pair 7, becomes equal to the reference voltage Vref of the reference voltage generating circuit 6. As a result, the output voltage Vout is controlled so as to be stabilized.

Even if the difference between the input voltage Vin to the series regulator and the output voltage Vout from the series regulator becomes small owing to the reduction in the input voltage Vin, the amplifier 5 is biased by the voltage stepped up from the input voltage Vin. Hence, the amplifier 5 can supply a sufficiently high gate voltage to the NMOS transistor 4.

However, the conventional charge pump circuit 9 described above is connected only to the input voltage Vin, the ground and the amplifier 5. In this connection configuration, the stepped-up voltage with reference to the input voltage is used as the power supply voltage for the amplifier 5. For this reason, when the input voltage is sufficiently higher than the output voltage, the voltage is excessively high as the power supply voltage for the control drive circuit, and power consumption increases. In other words, in the configuration of the output circuit of the conventional series regulator described above, the drive voltage to the NMOS transistor 4 serving as an output transistor can be obtained securely. However, conversely, when the input voltage Vin is high, the voltage stepped up by the charge pump circuit 9 is high, and the power consumption in the amplifier 5 increases. Furthermore, in the case of a power amplifier, the output voltage of which is changed, it is necessary to sufficiently drive the output transistor even when the difference between the input and output voltages is small. However, since the difference between the input and output voltages is sufficient in most of the operation times, the above-mentioned increase in the power consumption in the amplifier 5 becomes further significant.

SUMMARY OF THE INVENTION

An object of the present invention is to provide an output circuit applied to a series regulator or a power amplifier, capable of suppressing the increase in power consumption while securely obtaining the drive voltage for an output transistor even when the output transistor is an NMOS transistor or an NPN transistor.

To solve the problem described above, a first output circuit according to the present invention comprises an output transistor having one main terminal to which an input voltage is input, the other main terminal from which an output voltage is output and a control terminal, wherein a drive voltage being equal to or higher than the drive threshold voltage with reference to the potential of the other main terminal is applied to the control terminal, whereby the impedance between the one main terminal and the other main terminal can be controlled; a control drive circuit for supplying the drive voltage to the control terminal of the output transistor to control the output voltage from the other main terminal of the output transistor; and a charge pump circuit, configured so as to output a predetermined voltage being equal to or higher than the drive threshold voltage with reference to the potential of the other main terminal of the output transistor, for supplying the power supply voltage obtained by adding the predetermined voltage being equal to or higher than the drive threshold voltage to the output voltage from the other main terminal of the output transistor.

A second output circuit according to the present invention comprises an output transistor having one main terminal to which an input voltage is input, the other main terminal from which an output voltage is output and a control terminal, wherein a drive voltage being equal to or higher than the drive threshold voltage with reference to the potential of the other main terminal is applied to the control terminal, whereby the impedance between the one main terminal and the other main terminal can be controlled; a control drive circuit for supplying the drive voltage to the control terminal of the output transistor to control the output voltage from the other main terminal of the output transistor; and a charge pump circuit, configured so as to output a voltage with reference to the potential of the one main terminal of the output transistor, for carrying out control so that the power supply voltage supplied to the control drive circuit is the voltage obtained by adding a predetermined voltage being equal to or higher than the drive threshold voltage to the output voltage from the other main terminal of the output transistor.

With the configuration described above, the power supply voltage supplied to the control drive circuit for driving the output transistor becomes the voltage obtained by adding a voltage being equal to or higher than the drive threshold voltage of the output transistor to the output voltage from the other main terminal of the output transistor, whereby the drive voltage for the output transistor can be obtained securely. Furthermore, since the drive voltage is not affected by the difference between the input and output voltages of the output transistor, the drive voltage can be set at the required minimum voltage being equal to or higher than the drive threshold voltage of the output transistor. It is thus possible to suppress the power consumption in the control drive circuit while the drive voltage for the output transistor is obtained securely.

In the output circuit having the configuration described above, the output transistor is preferably, for example, an NMOS transistor or an NPN transistor.

Furthermore, in the output circuit having the configuration described above, it is preferable that the control drive circuit has a differential amplifier, that the output voltage from the other main terminal of the output transistor or a voltage with reference to the output voltage from the other main terminal of the output transistor is input to one of the input terminals of the differential amplifier, that a reference voltage or a voltage to be amplified is input to the other input terminal of the differential amplifier, and that the output voltage of the differential amplifier is supplied to the control terminal of the output transistor as the drive voltage.

Moreover, in the first output circuit configured as described above, it is preferable that the charge pump circuit comprises a DC power supply for generating a predetermined voltage, a first capacitor, a first switching circuit for charging the first capacitor from the DC power supply, a second capacitor, one terminal of which is connected to the other main terminal of the output transistor, and a second switching circuit for charging the second capacitor from the first capacitor, and that the voltage appearing at the other terminal of the second capacitor is supplied to the control drive circuit.

In the configuration described above, it is preferable that the predetermined voltage generated by the DC power supply is set at a voltage equal to or higher than the drive threshold voltage of the output transistor.

In the second output circuit configured as described above, it may be possible that the charge pump circuit comprises a DC power supply for generating a predetermined voltage, a first capacitor, a first switching circuit for charging the first capacitor from the DC power supply, a second capacitor, one terminal of which is connected to the one main terminal of the output transistor, and a second switching circuit for charging the second capacitor from the first capacitor, and that the voltage generated at the other terminal of the second capacitor is supplied to the control drive circuit.

With this configuration, it is preferable that the predetermined voltage generated by the DC power supply is set at the voltage obtained by adding a voltage equal to or higher than the drive threshold voltage of the output transistor to the output voltage from the other main terminal of the output transistor and by subtracting the input voltage to the one main terminal of the output transistor from the sum of the addition.

In addition, in the second output circuit configured as described above, it is preferable that the DC power supply has a differential amplifier, a transistor and a third capacitor, that the voltage appearing at the other terminal of the second capacitor or a voltage with reference to the voltage appearing at the other terminal of the second capacitor is input to one of the input terminals of the differential amplifier, that the reference voltage is input to the other input terminal of the differential amplifier, that the output voltage of the differential amplifier is supplied to the control terminal of the transistor, that one main terminal of the transistor is connected to the one main terminal of the output transistor, that the other main terminal of the transistor is connected to one terminal of the third capacitor, that the other terminal of the third capacitor is grounded, and that the voltage is output from across the terminals of the third capacitor.

With the output circuit according to the present invention, a charge pump is formed such that the power supply voltage of the control drive circuit, such as an amplifier for driving the output transistor, becomes the voltage obtained by adding the voltage being equal to or higher than the drive threshold voltage of the output transistor to the output voltage. For example, when the output transistor is an NMOS transistor, the power supply voltage should only be the voltage obtained by adding a voltage higher than the drive threshold voltage of the NMOS transistor by 1 to 2 V to the voltage at the source terminal (the other main terminal) of the NMOS transistor, i.e., the output voltage thereof.

With this configuration, the predetermined drive voltage can be supplied stably to the control terminal of the output transistor regardless of the input/output voltages. For this reason, even when the NMOS transistor is used as the output transistor in a series regulator or a power amplifier, the drive voltage for the output transistor is obtained securely by the charge pump circuit and can be suppressed to the required minimum voltage, and the power consumption in the control drive circuit such as an amplifier can be suppressed.

DESCRIPTION OF PREFERRED EMBODIMENTS

Figure 1:
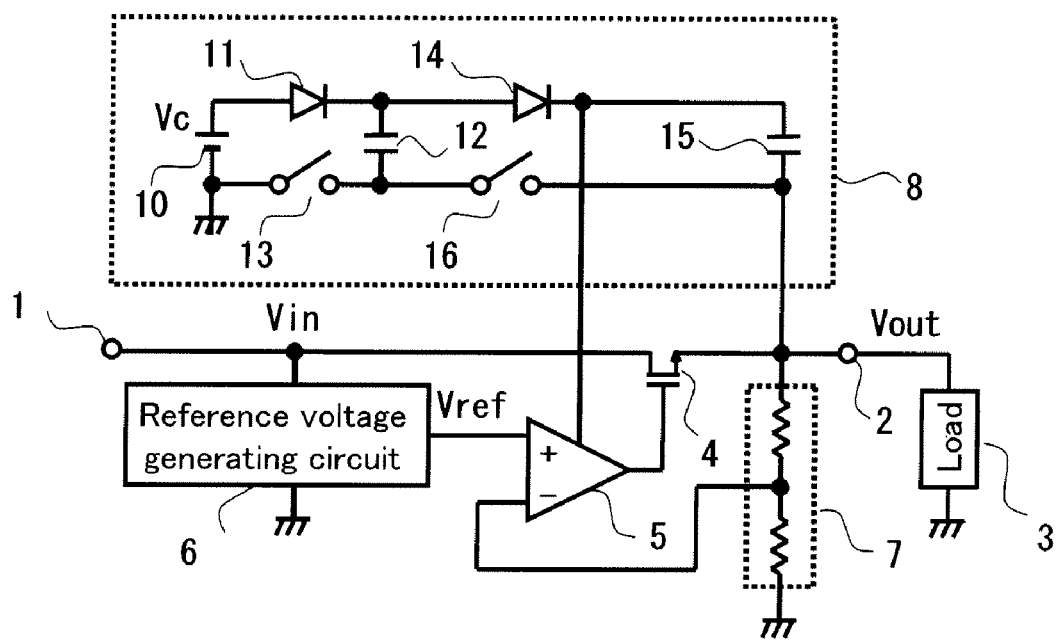
FIG. 1 is a circuit diagram showing the configuration of a series regulator having an output circuit according to Embodiment 1 of the present invention.

Embodiments according to the present invention will be described below referring to the drawings.

Embodiment 1

An output circuit according to Embodiment 1 of the present invention will be described below referring to the drawing. FIG. 1 is a circuit diagram showing the configuration of a series regulator having an output circuit according to Embodiment 1 of the present invention.

In FIG. 1, numeral 1 designates an input terminal. An input voltage Vin is applied to this input terminal 1.

Numeral 2 designates an output terminal. This output terminal 2 supplies an output voltage Vout to a load 3.

Numeral 4 designates an NMOS transistor serving as an output transistor. The drain terminal serving as one of the main terminals of this NMOS transistor 4 is connected to the input terminal 1, and the source terminal serving as the other main terminal thereof is connected to the output terminal 2.

Numeral 5 designates an amplifier. This amplifier 5 supplies a drive voltage to the gate terminal serving as the control terminal of the NMOS transistor 4.

Numeral 6 designates a reference voltage generating circuit. This reference voltage generating circuit 6 generates a reference voltage Vref and applies the generated reference voltage Vref to the non-inverting input terminal (+) of the amplifier 5.

Numeral 7 designates a resistor pair consisting of two voltage-dividing resistors connected in series. This resistor pair 7 divides the output voltage Vout, and the divided voltage is applied to the inverting input terminal (−) of the amplifier 5. The circuit may be configured such that the output voltage Vout is directly applied to the inverting input terminal (−) of the amplifier 5, without being divided.

Numeral 8 designates a charge pump circuit. This charge pump circuit 8 supplies a power supply voltage to the amplifier 5.

A specific configuration of the charge pump circuit 8 will herein be described. The charge pump circuit 8 comprises a DC power supply 10 for generating a DC voltage Vc, a first rectifying device 11, a first capacitor 12, a first switching device 13, a second rectifying device 14, a second capacitor 15 and a second switching device 16 that is turned on and off complementarily with the first switching device 13. The first rectifying device 11 and the first switching device 13 constitute a first switching circuit, and the second rectifying device 14 and the second switching device 16 constitute a second switching circuit.

In this charge pump circuit 8, when the first switching device 13 is ON, a current path is formed so that the first capacitor 12 is charged by the DC power supply 10 via the first rectifying device 11. Furthermore, when the second switching device 16 is ON, a current path is formed so that the second capacitor 15 is charged by the first capacitor 12 via the second rectifying device 14. The low-potential terminal of the second capacitor 15 is connected to the output terminal 2, and the high-potential terminal thereof is connected to the power supply terminal of the amplifier 5. Hence, the voltage obtained by adding the output voltage of the charge pump circuit 8 to the output voltage Vout is supplied to the power supply terminal of the amplifier 5.

The voltage Vc of the DC power supply 10 may be generated from the input voltage Vin using a series regulator or the like or may be the output voltage of a voltage supply circuit configured separately. It is desired that the voltage Vc is stabilized at a voltage equal to or higher than the gate-source voltage Vgs that can sufficiently drive the NMOS transistor 4. Furthermore, the input voltage Vin may be used as the voltage Vc of the DC power supply 10 if the input voltage Vin is equal to or higher than the gate-source voltage Vgs that can sufficiently drive the NMOS transistor 4.

An oscillation circuit and a drive circuit for complementarily turning on and off the first switching device 13 and the second switching device 16 are not shown or described in detail. These circuits may be formed inside the series regulator, or an oscillation circuit provided in a power supply circuit, such as a switching regulator configured separately, may also be used.

The operation of the series regulator shown in FIG. 1 will be described below. When the input voltage Vin is applied to the input terminal 1, the charge pump circuit 8 operates, and the voltage obtained by adding the voltage Vc to the output voltage Vout is supplied to the amplifier 5 as a power supply voltage. Hence, the amplifier 5 operates, and the NMOS transistor 4 is driven by the amplifier 5, and the output voltage Vout is output from the output terminal 2. The output voltage Vout is negatively fed back to the amplifier 5 through the resistor pair 7. The amplifier 5 carries out feedback control for the NMOS transistor 4 so that the divided voltage of the output voltage Vout, being output from the resistor pair 7, becomes equal to the reference voltage Vref of the reference voltage generating circuit 6. As a result, the output voltage Vout is controlled so as to be stabilized.

Even if the difference between the input voltage Vin and the output voltage Vout of the series regulator becomes small owing to the reduction in the input voltage Vin, the amplifier 5 is biased by the voltage (Vout+Vc). Hence, the amplifier 5 can supply a sufficiently high gate voltage to the NMOS transistor 4. Furthermore, if the voltage Vc is equal to or higher than the gate-source voltage Vgs that can sufficiently drive the NMOS transistor 4 and stabilized to the required minimum voltage, the power consumption in the amplifier 5 is also suppressed to the required minimum.

With the configuration described above, the power supply voltage of the amplifier 5 serving as a control drive circuit becomes the sum voltage (Vout+Vc) of the output voltage Vout and the voltage Vc of the charge pump circuit 8. Hence, a drive voltage up to the voltage Vc of the charge pump circuit 8 can be supplied as the gate-source voltage Vgs to the control terminal of the NMOS transistor 4 in which the voltage of the source terminal serving as the other main terminal becomes the output voltage Vout. The output voltage Vc of the charge pump circuit 8 is stabilized at a voltage equal to or higher than the gate-source voltage Vgs that can sufficiently drive the NMOS transistor 4 and further stabilized to the required minimum voltage. In other words, a drive voltage equal to or higher than the gate-source voltage Vgs that can sufficiently drive the NMOS transistor 4 can be supplied to the control terminal of the NMOS transistor 4, regardless of the input voltage Vin. In addition, since the power supply voltage (Vout+Vc) of the amplifier 5 serving as a control drive circuit also becomes the required minimum, the power consumption in the amplifier 5 serving as a control drive circuit is also suppressed to the required minimum.

Embodiment 2

Figure 2:
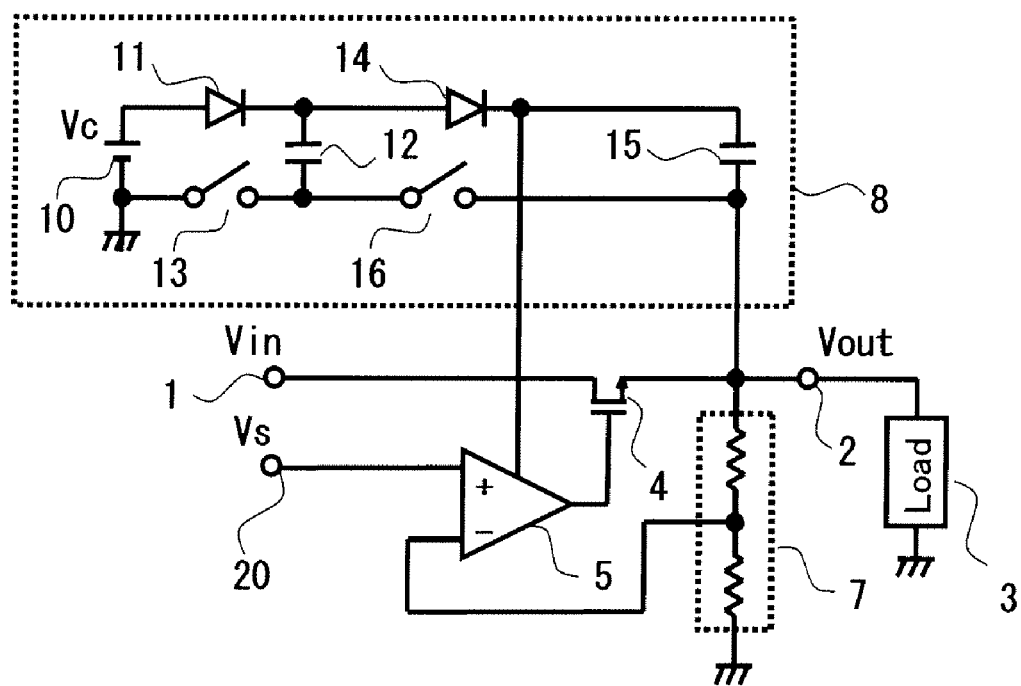
FIG. 2 is a circuit diagram showing the configuration of a power amplifier having an output circuit according to Embodiment 2 of the present invention.

An output circuit according to Embodiment 2 of the present invention will be described below referring to the drawing. FIG. 2 is a circuit diagram showing the configuration of a power amplifier having the output circuit according to Embodiment 2 of the present invention. Components similar to those shown in FIG. 1 are designated by the same numerals, and their descriptions are omitted. The configuration shown in FIG. 2 differs from that shown in FIG. 1 in that instead of the reference voltage Vref shown in FIG. 1, an input signal voltage Vs supplied from the outside to a terminal 20 is applied to the non-inverting input terminal (+) of the amplifier 5.

The operation of the power amplifier shown in FIG. 2 will be described below. When the input voltage Vin is applied to the input terminal 1, the charge pump circuit 8 operates, and the voltage obtained by adding the voltage Vc to the output voltage Vout is supplied to the amplifier 5 as a power supply voltage. Hence, the amplifier 5 operates, and the NMOS transistor 4 is driven by the amplifier 5, and the output voltage Vout is output from the output terminal 2. The output voltage Vout is negatively fed back to the amplifier 5 through the resistor pair 7. The amplifier 5 carries out feedback control for the NMOS transistor 4 so that the divided voltage of the output voltage Vout, being output from the resistor pair 7, becomes equal to the input signal voltage Vs. As a result, the output voltage Vout is controlled to the voltage obtained by amplifying the input signal voltage Vs. When it is desired that the control is carried out so that the output voltage Vout becomes equal to the input signal voltage Vs, the output voltage Vout should only be directly applied to the inverting input terminal (−) of the amplifier 5, instead of being divided, as a matter of course.

Even if the difference between the input voltage Vin and the output voltage Vout of the power amplifier becomes small owing to the increase in the input signal voltage Vs or the decrease in the input voltage Vin, the amplifier 5 is biased by the voltage (Vout+Vc). Hence, the amplifier 5 can supply a sufficiently high gate voltage to the NMOS transistor 4. Furthermore, if the voltage Vc is equal to or higher than the gate-source voltage Vgs that can sufficiently drive the NMOS transistor 4 and stabilized to the required minimum voltage, the power consumption in the amplifier 5 is also suppressed to the required minimum.

The effect of Embodiment 2 is similar to that of Embodiment 1.

Embodiment 3

In the respective embodiments described above, the second capacitor 15 serving to provide a bias to the amplifier 5 and serving as the drive power supply for the NMOS transistor 4 is provided on the output terminal 2. In other words, one terminal of the second capacitor 15 is connected to the output terminal 2. Hence, the charging current of the second capacitor 15 in the charge pump circuit 8 flows from the output terminal 2 to the load 3. The minute fluctuation in the output voltage Vout due to the charging current is occasionally undesirable depending on the load 3.

Figure 3:
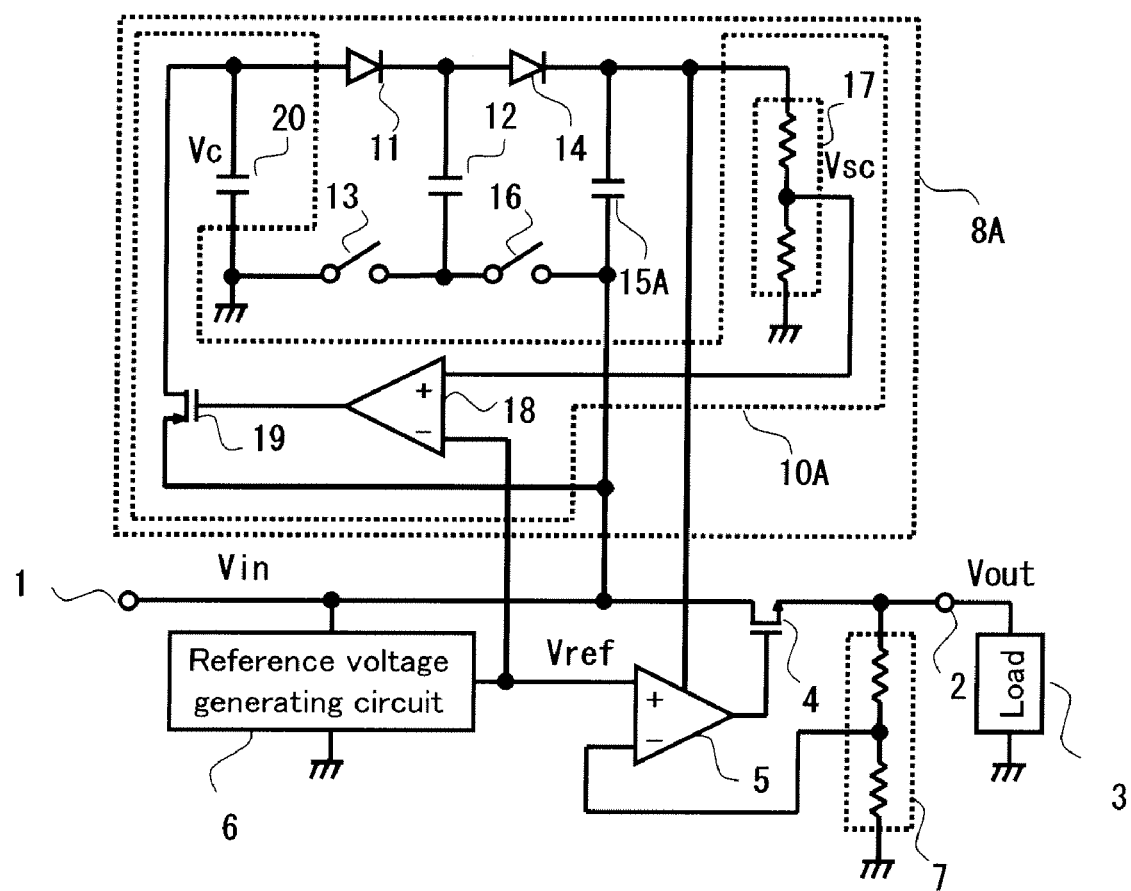
FIG. 3 is a circuit diagram showing the configuration of a series regulator having an output circuit according to Embodiment 3 of the present invention.
Figure 4:
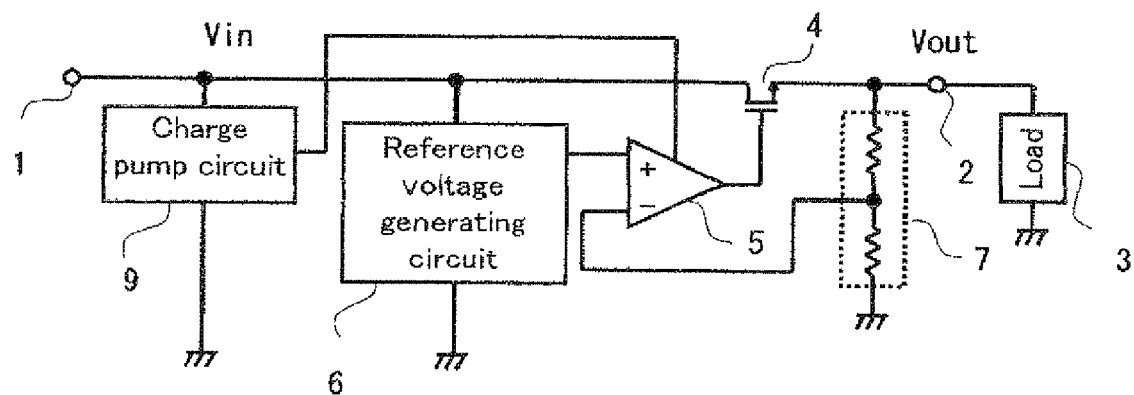
FIG. 4 is a circuit diagram showing the configuration of the series regulator having the conventional output circuit.

Hence, a configuration in which one terminal of a capacitor serving as the drive power supply for the NMOS transistor 4 is provided on the input terminal 1, that is, a configuration in which one terminal of the second capacitor 15 is connected to the input terminal 1 will be described below. FIG. 3 is a circuit diagram showing the configuration of a series regulator having an output circuit according to Embodiment 3 of the present invention.

In FIG. 3, components similar to those shown in FIG. 1 are designated by the same numerals, and their descriptions are omitted. The configuration shown in FIG. 3 differs from that shown in FIG. 1 in the configuration of the charge pump circuit that is designated by numeral 8A. In the charge pump circuit 8A, a DC power supply 10A for generating the DC voltage Vc comprises a resistor pair 17 that divides the output voltage of the charge pump circuit 8A, i.e., the bias voltage of the amplifier 5, and outputs a detection voltage Vsc; an amplifier 18 that amplifies the error between the detection voltage Vsc and the reference voltage Vref generated by the reference voltage generating circuit 6; a PMOS transistor 19, the source terminal of which is connected to the input terminal 1 and the gate terminal of which receives the output of the amplifier 18 so that the PMOS transistor 19 is feedback-controlled; and a capacitor 20 connected between the drain terminal of the PMOS transistor 19 and the ground.

The configurations of the first rectifying device 11, the first capacitor 12, the first switching device 13 and the second rectifying device 14 are the same as those shown in FIG. 1, and the low-potential terminal of a second capacitor 15A is connected to the input terminal 1.

As described above, the DC power supply 10A of the charge pump circuit 8A constitutes a series regulator in which the voltage Vc is feedback-controlled so that the output voltage of the charge pump circuit 8A, serving as the power supply voltage for the amplifier 5, is stabilized at a predetermined value. When it is assumed that a voltage Vg is a voltage equal to or higher than the gate-source voltage Vgs that can sufficiently drive the NMOS transistor 4 and is the required minimum voltage, this predetermined value is set at the voltage (Vout+Vg) obtained by adding the voltage Vg to the output voltage Vout of the series regulator. In other words, the DC power supply 10A carries out feedback control so that the voltage Vc of the capacitor 20 to be added to the input voltage Vin becomes (Vout+Vg−Vin). As a result, the output voltage of the charge pump circuit 8A, controlled so as to be stabilized at (Vout+Vg) regardless of the input voltage Vin, is supplied to the amplifier 5 as the power supply voltage. Hence, the power consumption in the amplifier 5 is suppressed to the required minimum as in the embodiments described earlier.

The predetermined voltage Vc generated by the DC power supply 10A is set at the voltage (Vc=Vg+Vout−Vin) obtained by adding the voltage Vg being equal to or higher than the drive threshold voltage for the transistor 4 to the output voltage Vout and by subtracting the input voltage Vin from the sum of the addition. On the other hand, since the output voltage V8A of the charge pump circuit 8A, serving as the power supply voltage for the amplifier 5, is the voltage obtained by adding the predetermined voltage Vc to the input voltage Vin, the following equation is obtained:

$$V8A = Vin + Vc = Vg + Vout$$

In each embodiment described above, the rectifying devices of the charge pump circuit are each represented by the symbol of a diode in the drawings. However, it may be possible to provide a synchronous rectifying circuit in which the first rectifying device 11 is formed of a switching device that turns on and off in synchronization with the first switching device 13 and the second rectifying device 14 is formed of a switching device that turns on and off in synchronization with the second switching device 16, for example.

Furthermore, although a series regulator is described in Embodiment 3, even in the case of a power amplifier, a charge pump circuit can also be formed in a way similar to that shown in FIG. 3 as a matter of course. In other words, a power amplifier is achieved by using a configuration in which the terminal 20 is provided instead of the reference voltage generating circuit 6 and the input signal voltage Vs is input from the outside to the terminal 20 in FIG. 3.

Moreover, although an NMOS transistor is used as an output transistor in the embodiments described above, an NPN transistor can also be used.

The difference of Embodiment 1 and Embodiment 2 from Embodiment 3 will herein be described.

In Embodiment 1 and Embodiment 2, the low-potential side of the output terminals of the charge pump circuit 8 is set at the potential of the other main terminal (the source terminal) of the output transistor 4. In other words, the charge pump circuit 8 operates with reference to the output voltage.

On the other hand, the charge pump circuit 8A according to Embodiment 3 operates with reference to the input voltage.

However, in the charge pump circuit 8A, the voltage of the capacitor 20 is feedback-controlled so that the power supply voltage of the amplifier 5 (control drive circuit) becomes equal to or higher than the output voltage+the drive threshold voltage. The present invention is characterized in that the power supply voltage of the control drive circuit becomes the voltage obtained by adding the voltage equal to or higher than the drive threshold voltage to the output voltage. For this reason, the voltage equal to or higher than the drive threshold voltage can be stably supplied to the control terminal of the output transistor 4, regardless of the input/output voltages.

INDUSTRIAL APPLICABILITY

The output circuit of the present invention is useful for series regulators and power amplifiers.

What is claimed is:

1. An output circuit comprising:
   an output transistor having a first main terminal to which an input voltage is input, a second main terminal from which an output voltage is output and a control terminal, wherein a drive voltage supplied to the control terminal is equal to or higher than the drive threshold voltage of the output transistor, the drive voltage being generated in response to a potential of the second main terminal, whereby an impedance between the first main terminal and the second main terminal can be controlled;
   a control drive circuit for supplying said drive voltage to the control terminal of said output transistor to control the output voltage from the second main terminal of said output transistor; and
   a charge pump circuit, configured so as to output a predetermined voltage being equal to or higher than said drive threshold voltage; said predetermined voltage being generated in response to the potential of the second main terminal of said output transistor, for supplying a power supply voltage to the control drive circuit, the power supply voltage being obtained by adding the predetermined voltage to the output voltage from the second main terminal of said output transistor.

2. The output circuit according to claim 1, wherein said output transistor is an NMOS transistor or an NPN transistor.

3. The output circuit according to claim 1, wherein
   said control drive circuit has a differential amplifier, wherein
   the output voltage from the second main terminal of said output transistor or a voltage with reference to the output voltage from the second main terminal of said output transistor is input to an input terminal of said differential amplifier, a reference voltage or a voltage to be amplified is input to another input terminal of said differential amplifier, and an output voltage of said differential amplifier is supplied to the control terminal of said output transistor as said drive voltage.

4. The output circuit according to claim 1, wherein
   said charge pump circuit comprises:
   a DC power supply for generating a predetermined voltage,
   a first capacitor,
   a first switching circuit for charging said first capacitor from said DC power supply,
   a second capacitor, one terminal of which is connected to the second main terminal of said output transistor, and
   a second switching circuit for charging said second capacitor from said first capacitor, wherein
   a voltage appearing at another terminal of said second capacitor is supplied to said control drive circuit.

5. The output circuit according to claim 4, wherein the predetermined voltage generated by said DC power supply is set at a voltage equal to or higher than the drive threshold voltage of said output transistor.

6. An output circuit comprising:
   an output transistor having a first main terminal to which an input voltage is input, a second main terminal from which an output voltage is output and a control terminal, wherein a drive voltage supplied to the control terminal is equal to or higher than the drive threshold voltage of the output transistor, the drive voltage being generated in response to a potential of the second main terminal, whereby an impedance between the first main terminal and the second main terminal can be controlled;
   a control drive circuit for supplying said drive voltage to the control terminal of said output transistor to control the output voltage from the second main terminal of said output transistor; and
   a charge pump circuit, configured so as to output a voltage with reference to the potential of the second main terminal of said output transistor, for carrying out control so that a power supply voltage supplied to said control drive circuit is the voltage obtained by adding a predetermined voltage being equal to or higher than said drive threshold voltage to the output voltage from the second main terminal of said output transistor.

7. The output circuit according to claim 6, wherein said output transistor is an NMOS transistor or an NPN transistor.

8. The output circuit according to claim 6, wherein
   said control drive circuit has a differential amplifier, wherein
   the output voltage from the second main terminal of said output transistor or a voltage with reference to the output voltage from the second main terminal of said output transistor is input to an input terminal of said differential amplifier, a reference voltage or a voltage to be amplified is input to another input terminal of said differential amplifier, and the output voltage of said differential amplifier is supplied to the control terminal of said output transistor as said drive voltage.

9. The output circuit according to claim 6, wherein
   said charge pump circuit comprises:
   a DC power supply for generating a predetermined voltage,
   a first capacitor,
   a first switching circuit for charging said first capacitor from said DC power supply,
   a second capacitor, one terminal of which is connected to the first main terminal of said output transistor, and
   a second switching circuit for charging said second capacitor from said first capacitor, wherein
   a voltage appearing at another terminal of said second capacitor is supplied to said control drive circuit.

10. The output circuit according to claim 9, wherein the predetermined voltage generated by said DC power supply is set at the voltage obtained by adding a voltage equal to or higher than the drive threshold voltage of said output transistor to the output voltage from the second main terminal of said output transistor and by subtracting the input voltage to the first main terminal of said output transistor from the sum of the addition.

11. The output circuit according to claim 9, wherein
   said DC power supply has a differential amplifier, a transistor and a third capacitor, wherein
   the voltage appearing at the other terminal of said second capacitor or a voltage with reference to the voltage appearing at the other terminal of said second capacitor is input to an input terminal of said differential amplifier, the reference voltage is input to another input terminal of said differential amplifier, and an output voltage of said differential amplifier is supplied to the control terminal of said transistor, a first main terminal of said transistor is connected to the first main terminal of said output transistor, a second main terminal of said transistor is connected to a first terminal of said third capacitor, a second terminal of said third capacitor is grounded, and said predetermined voltage is output from across the terminals of said third capacitor.

* * * * *